United States Patent [19]

Manabe et al.

[11] Patent Number: 4,551,387

[45] Date of Patent: Nov. 5, 1985

[54] COLORED RESINOUS ARTICLES WITH CONCEALED METALLIC LUSTER

[75] Inventors: Katsuhide Manabe; Masatoshi Tsutsui, both of Ichinomiya, Japan

[73] Assignee: Toyoda Gosei Kabushiki Kaisha, Nishikasugai, Japan

[21] Appl. No.: 532,153

[22] Filed: Sep. 14, 1983

[51] Int. Cl.$^4$ ............................................. B32B 27/40
[52] U.S. Cl. .................................. 428/336; 427/404; 427/407.1; 427/409; 428/425.8; 428/423.3; 428/424.2; 428/424.7; 428/423.7
[58] Field of Search ............... 428/425.8, 424.7, 423.3, 428/424.8, 424.2, 336

[56] References Cited

U.S. PATENT DOCUMENTS

| | | | |
|---|---|---|---|
| 4,104,432 | 8/1978 | Manabe | 428/423.3 |
| 4,268,570 | 5/1981 | Imanak | 428/425.8 |
| 4,305,981 | 12/1981 | Muroi | 428/425.8 |
| 4,369,225 | 1/1983 | Manabe et al. | 428/336 |

FOREIGN PATENT DOCUMENTS 0140128  2/1980  German Democratic Rep. .............................. 428/425.8

*Primary Examiner*—Sam Silverberg
*Attorney, Agent, or Firm*—Cushman, Darby & Cushman

[57] ABSTRACT

A colored resinous article having a lurking or underlying tone of metallic luster which comprises (a) a resinous molded article having been overlaid on the surface thereof successively with (b) a highly weather-resistant two-component polyurethane paint or UV-curable paint as a base coat, (c) a filmy layer of a metal of 20–300Å in thickness and (d) a highly weather-resistant and abrasion-resistant two-component polyurethane paint or UV-curable paint as a top coat, either of said (a) and said (b) having incorporated thereinto a material of a desired color tint. The colored resinous articles with a concealed tone of metallic luster are manufactured by applying onto the surface of (a) a resinous molded article (b) a highly weather-resistant two-component polyurethane paint or UV-curable paint as base coat, either of said (a) and said (b) having incorporated thereinto a material of a desired color tint, applying (c) a filmy layer of a metal of 20–300Å in thickness onto the base coat by means of dry plating, and then applying (d) a highly weather-resistant and abrasion-resistant two-component polyurethane paint or UV-curable paint as top coat onto said (c). The colored resinous article with a concealed tone of metallic luster possess a deeply noble feeling and strong resistance to weathering action and abrasion. Thus, these colored resinous articles are useful as outdoor ornaments, especially as ornamental parts of motor vehicles.

21 Claims, No Drawings

COLORED RESINOUS ARTICLES WITH CONCEALED METALLIC LUSTER

BACKGROUND OF THE INVENTION

1. Field of the Invention

The present invention relates to colored resinous articles with lurking metallic luster and to a process for manufacturing same. More particularly, the present invention relates to colored resinous articles with a concealed tone of metallic luster comprised of resinous moldings as the substrate overlaid successively with a base coat, a very thin metal film and a protective top coat as well as a process for the manufacture of such colored resinous articles wherein a material having a desired color tint is previously incorporated into either of the substrate or the base coat and the substrate is overlaid successively with the base coat, the thin metal film and the top coat by a method known per se.

2. Description of the Prior Arts

Heretofore, lustrously metallized resinous products are known which are manufactured by metallizing treatments of various resinous moldings. For example, U.S. Pat. No. 4,369,225 discloses flexible lustrously metallized resinous moldings manufactured by applying a base coat, a metal film and a protective top coat onto flexible resinous moldings. Such metallized resinous products possess brilliant metallic luster and flexibility inherent to resinous materials and thus are useful as ornaments in lieu of metallic products. All of these metallized products are of brilliant metallic appearance but those having a desired color with a concealed tone of metallic luster have not yet been proposed.

In recent years, there is an increasing demand of colored resinous articles having a concealed tone of metallic luster with the design of imparting a deeply noble feeling and new aesthetic value in appearance to resinous parts of motor vehicles. For realizing such demand it is necessary to impart a concealed tone of metallic luster in place of brilliant metallic luster while retaining the original color tint of the colored resinous articles. From the past, a dry plating method such as vacuum evaporation, sputtering or ion plating is known as a means for imparting metallic luster to resinous articles. However, the application of such a known dry plating method to the above incurs various undesirable results; the weather-resistance of the product becomes poor and considerable degradation takes place in the resinous article and the base coat so that the appearance of the product will be damaged by significant discoloration or fading of the colored resinous article. According to the known metallizing treatments adopting such dry plating method, the thickness of the metal film formed exceeds 400–500 Å so that the resinous article is completely covered with the plated metal film, thus giving only metallic feeling in appearance. In the prior art methods, therefore, there was no technical concept of manufacturing metallized resinous articles as contemplated in the present invention, which show a deeply noble feeling in appearance by a concealed tone of metallic luster with the original tint of the colored resinous article or the base coat. Further, the conventional metallized products obtained according to the dry plating method tend to permit the formation of cracks on the metal film formed. Thus, the base coat has to be cured quickly to prevent the formation of cracks on the metal film. Even if a two-component polyurethane paint is used as the base coat, therefore, a yellowing type such as tolylene diisocyanate is actually used which permits rapid curing.

The metallized resinous articles obtained according to the conventional dry plating method find wide utility as outdoor ornamental parts of motor-vehicles. In case the articles with a metal film as thick as 400–500 Å or more are irradiated with sun light, harmful UV-rays are almost reflected by such relatively thick metal film. Thus, there is no or a little demand for weather-resisting property for the base coat paint.

If the metal film in the metallized articles is as thin as 20–300 Å, UV-rays in sun light easily penetrate into the base coat or the molded article as substrate through such a thin metal film. Thus, weather-resistance is needed for the base coat and even for the substrate. Anyway, all of the conventional metallized resin articles show metallic feeling in appearance but no technical research has yet been reported hitherto for manufacturing metallized resinous articles showing a deeply noble feeling by their a concealed tone of metallic luster with the original color tint of the resinous material.

Recently, there arises a great demand for developing a new type of metallized resinous articles with a deeply noble feeling in the field of automobile industry with a view to improving ornamental or aesthetic value in appearance of the metallized resinous articles.

BRIEF SUMMARY OF THE INVENTION

Accordingly, it is an object of the present invention to provide new type colored resinous articles with a concealed tone of metallic luster.

It is another object of the present invention to provide colored resinous articles with a concealed tone of metallic luster exhibiting a deeply noble feeling.

It is still another object of the present invention to provide new type weather-resistant and abrasion-resistant metallized resinous moldings useful as ornamental parts for motor vehicles.

It is further object of the present invention to provide a process for the manufacture of the colored resinous articles with a concealed tone of metallic luster wherein a very thin metal film is applied onto the surface of the resinous articles having a colored base coat or substrate.

Other and further objects, features and advantages of the present invention will become apparent more fully from the following description.

DETAILED DESCRIPTION OF THE INVENTION

As a result of extensive researches made on various kinds of coating paints and the influence of the thickness of a metal film on the relationship between the metallic luster and the color tint of the resinous material, it has now been found that colored resinous articles with a concealed tone of metallic luster which gives them a deeply noble feeling and improved aesthetic value in appearance are obtained by a combination of specific coating paints with a specific metal film which is unbelievably thin from the normal sense for metallizing resinous articles. The present invention has been accomplished on the basis of the above finding.

In accordance with one embodiment of the present invention, there is provided a colored resinous article with a concealed tone of metallic luster which comprises (a) a resinous molded article having been overlaid on the surface thereof successively with (b) a highly weather-resistant two-component polyurethane paint or UV-curable paint as a base coat, (c) a filmy layer of a metal as thin as 20–300 Å and (d) a highly weather-resistant and abrasion-resistant two-component polyurethane paint or UV-curable paint as a top coat, either of said (a) and said (b) having incorporated thereinto a material of a desired color tint.

In accordance with another embodiment of the present invention, there is provided a process for the manufacture of a colored resinous article with lurking metallic luster, which comprises applying onto the surface of (a) a resinous molded article (b) a highly weather-resistant two-component polyurethane paint or UV-curable paint as base coat, either of said (a) and said (b) having incorporated thereinto a material of a desired color tint, applying (c) a filmy layer of a metal of 20–300 Å in thickness onto the base coat by means of dry plating, and then applying (d) a highly weather-resistant and abrasion-resistant two-component polyurethane paint or UV-curable paint as top coat onto said (c).

The resinous molded articles used as substrate of the product of this invention are manufactured from various kinds of polymeric or polymerizable materials by injection molding, extrusion or the like means. The polymerizable or thermocurable resins used for making the molded articles include those of phenol series, urea series, epoxy series and unsaturated polyester series. The polymeric or thermoplastic resins are generally selected from ABS, PP, PVC, AAS, AES, AS, EPDM and engineering plastics such as PMMA, PC, PBT, PET and PA and a polyblend of these resins. The use of thermoplastic resins such as ABS and its polyblend of other thermoplastic resins are generally preferable. Usually, AAS and AES are employed for the application where high weather-resistance is required, and PPO (Noryl) resins, PMMA, PC, PBT, PET and PA are employed for the application where heat-resistance and high elasticity are required. Thermoplastic polyurethane elastomers of the polyester or polyether series are excellent in elasticity and cold-resistance. Thus, the resins are employed alone or as a polyblend according to the intended purpose of the molded articles therefrom.

The highly weather-resistant two-component polyurethane paint or UV-curable paint used as the base coat should exibit good adhesion to both the substrate and the thin metal film and should be excellent in levelling. The polyol component of the two-component polyurethane is generally selected from highly weather-resistant polyols such as acrylic polyol, polyester polyol and polyether polyol. The use of the acrylic polyols in copolymeric form having a hydroxyl number of 10–250 and a number average molecular weight of 500–4000 are preferable, which are prepared as a rule by polycondensing one or more aliphatic glycols with acrylic and/or methacrylic acid to form a hydroxyalkyl acrylate and/or methacrylate and then copolymerizing it with an alkyl acrylate and/or methacrylate. Examples of the aliphatic glycols include straight chain glycols such as ethylene glycol, 1,2-propylene glycol, 1,2-butylene glycol, 1,3-butylene glycol, 1,4-butanediol and 1,6-hexanediol. Illustrative of the alkyl acrylate and/or methacrylate to be copolymerized with the hydroxyalkyl acrylate and/or methacrylate are, for example, methyl acrylate or methacrylate, ethyl acrylate or methacrylate, propyl acrylate or methacrylate, butyl acrylate or methacrylate, hexyl acrylate or methacrylate and 2-ethylhexyl acrylate or methacrylate.

The polyisocyanate component of the two-component polyurethane is preferably selected from anti-yellowing polyisocyanates having high weather-resistance. By the term "anti-yellowing polyisocyanate" is meant a polyisocyanate which shows no distinct yellowing phenomenon even after the lapse of a long period of time. In general, such anti-yellowing polyisocyanate has neither aromatic groups nor color-forming groups in the molecule. Illustrative of the anti-yellowing polyisocyanate are, for example, aliphatic diisocyanates such as 1,6-hexamethylene diisocyanate and cycloaliphatic diisocyanates such as those of isophorone series. These anti-yellowing polyisocyanates are commercially available and may be used singly or as a mixture of at least two. A polymeric diisocyanate obtained for example, by mixing one or more of these diisocyanates with polyol may also be used equivalently.

The UV-curable paint contains as the predominant component an unsaturated polyester polymerizable by the action of UV-rays. This polyester may usually be incorporated with one or more resin-forming materials and is derived by polycondensation from an unsaturated polycarboxylic acid and an alkylene glycol or from a saturated polycarboxylic acid and an alkenylene glycol. Preferable are such unsaturated polyester as derived from unsaturated polycarboxylic acids and alkylene glycols. Typical examples of the unsaturated polycarboxylic acid include fumaric acid, maleic acid and itaconic acid. Illustrative of the alkylene glycols are, for example, ethylene glycol, propylene glycol, 1,4-butanediol, diethylene glycol and dipropylene glycol. Examples of the saturated polycarboxylic acid include succinic acid, glutaric acid, adipic acid and isophthalic and terephthalic acid. A typical example of the alkenylene glycol is 2-butene-1,2-diol. The polycondensation of the polycarboxylic acid and the glycol is carried out in a usual manner by reacting the polycarboxylic acid in the form of a reactive functional derivative thereof such as an acid anhydride with the glycol in the presence of an esterifying catalyst or by transesterification of a lower alkyl ester of the polycarboxylic acid with the glycol. Examples of the resin-forming material copolymerizable with the unsaturated polycarboxylic acid include styrene and divinylbenzene.

The UV-curable paint should have good weather-resistance and may be incorporated with an UV-absorbing agent and the like additives to enhance their weather-resistance.

A coloring material is incorporated into either the substrate or the base coat to furnish it with a desired color tint. The coloring material is generally selected from inorganic and organic pigments possessing good weather-resistance. Typical examples of the inorganic pigments include carbon black for black, titanium dioxide and barium sulfate for white, chromium oxide for green, various iron oxides for yellow to red tint, various lead oxides for yellow to brown tints, cobalt blue for blue and cadium sulfide or tungsten oxide for yellow. Typical examples of the organic pigment include Phthalocyanine Blue, Phthalocyanine Green, Quinacridone Red, Yellow pigments of azo series, reddish pigments of chromophthalic Bordeaux series, and various arizarine lakes. These pigments are commercially available and may be used singly or as a mixture of at least two to obtain a desired color tint.

The metals utilizable for the metallization of the molded articles should preferably have good malleability and ductility and should be excellent in weather-resistance and corrosion-resistance if they are used for outdoor applications. Illustrative of the metals are, for example, Cu, Cr, Ti, Ag, Ni, W, Mo, Sb, Nb, Al, Zn, Sn and alloys such as Ni-Cr, various stainless steels and brass. Among these metals and alloys, Al, Sn, Zn or the like are inferior in corrosion-resistance and thus are used for indoor applications.

The two-component polyurethane or UV-curable paint applied as a protective top coat onto the surface of the thin metal film should be excellent in weather-resistance, abrasion-resistance, warm water-resistance and wax-removing property. So far as these requirements are satisfied, the same paint as used for the base coat may also be used for the top coat. In view of high abrasion-resistance, the use of the two-component polyurethane paint is preferable as the top coat. The polyurethane paint and UV-curable paint for the top coat are suitably selected from those described for the base coat.

In the preparation of the paint for the base coat or top coat, the polyurethane resin or UV-curable resin is dissolved or dispersed in a suitable inert solvent. Illustrative of the solvent are, for example, aromatic hydrocarbons such as benzene, toluene and xylene, ketones such as acetone, MEK and MIBK, esters such as ethyl acetate, butyl acetate and cellosolve acetate. These solvents may be used singly or preferably as a mixture of at least two.

The paint for the base coat or top coat may be incorporated with various additives to improve its properties such as weather-resistance. In general, a UV-absorbing agent is used in both of the base coat and top coat to enhance weather-resistance of these coats. Such an agent is commercially available or can easily be prepared according to a method known per se. This compound can also be used alone or as a mixture of at least two. The main function of this agent is of course to absorb UV-rays or the like actinic light to enhance weather-resistance, especially resistance to degradation of the coat by sunlight. Illustrative of the UV-absorbing agents are, for example, specific benzotriazole derivatives (various products under the trade name of "Tinuvin" marketed by Ciba-Geigy, Switzerland) such as 2-(2'-hydroxy-3',5'-di-tert-butylphenyl)-5-chlorobenzotriazole, 2-(2'-hydroxy-5'-methylphenyl)benzotriazole and 2-(3',5'-di-tert-butyl-2-hydroxyphenyl)benzotriazole, tetrakis-[methylene-(3',5'-di-tert-butyl-4-hydroxyhydrocinnamate)]methane, octadecyl-3-(3',5'-di-tert-butyl-4'-hydroxyphenyl)propionate and 2,2'-thiodiethyl-bis-[3-(3',5'-di-tert-butyl-4-hydroxyphenyl)]-propionate. These UV-absorbing agents are generally solid and have a relatively poor solubility in a vehicle used for the paint for the base coat or top coat. Thus, the UV-absorbing agent is usually employed in an amount up to about 1–10% by weight, preferably 3–7% by weight based on the vehicle used for the paint.

In case the UV-curable paint is used for the base coat or top coat, a small amount of a sensitizer may be incorporated into the paint for the purpose of promoting the radical polymerization caused by UV-rays. Examples of the sensitizer include benzoin methyl ether, benzophenone and diacetylthionine. These sensitizers are widely known in the field of photopolymerization and can be used singly or as a mixture of at least two.

In addition to the above additives, the paint may further contain an adequate amount of a levelling agent for improving eveness of the coating and the substrate article may be incorporated with an adequate amount of one or more fillers such as fibers, and also a small amount of a plasticizer in case of using colored PVC molded articles as substrate. These additives and their properties are well known among those skilled in the art.

According to the process of this invention, the resinous molded article as substrate is overlaid with the aforementioned polyurethane paint or UV-curable paint as base coat in the first treatment. A material of a desired color tint has to be incorporated into either of the substrate and the base coat prior to the application of the base coat. It is desirable to incorporate the substrate with the coloring material. The amount of the material is properly determined according to the intensity and effect of the desired color tint in the final product. In case of using the polyurethane paint, the proportion of the polyol component to the polyisocyanate component contained therein is almost theoretical based on the hydroxyl number of the polyol and the NCO content of the polyisocyanate. The paint is prepared in a usual manner by dissolving the resinous components and optional coloring material and additives in a solvent or a solvent mixture in an amount sufficient to give a viscous paint to be applied unformly onto the substrate. No particular limitation exists in the proportion of the resinous components to the solvent or a mixture thereof so far as the resultant paint can be applied by a conventional coating method.

The application of the paint onto the substrate is carried out according to a conventional coating method, for example, by means of spray coating, flow coating and dipping. If necessary, a primer may be applied onto the substrate prior to the application of the base coat. The base coat paint and such primer should generally be transparent if the substrate is colored, lest the original tint should be changed or masked. The resinous molded article thus coated with the base coat paint is then subjected to setting at a temperature and time sufficient for curing of the resinous components and evaporation of the solvents used. In case of using the UV-curable paint, the base coat formed is exposed under irradiation from a proper UV-rays generator such as a low voltage mercury lamp. The thickness of the base coat is usually adjusted within the range from 5$\mu$ to 100$\mu$, preferably within the rang efrom 10$\mu$ to 50$\mu$. However, the thickness may properly be adjusted according to the properties required for the intended purpose of the end product. In case the coloring material has been incorporated into the base coat, the desired color tint may be changed delicately by varying the thickness of the colored base coat.

In the second step of the coating treatment, a very thin filmy layer of the metal is formed on the surface of the entirely cured base coat by means of dry plating which is sometimes called physical vacuum deposition. In view of similarity in mechanism, "vacuum evaporation", "sputtering" and "ion plating" are often involved in the term "dry plating" in a broader sense of the meaning. These treatments are easily be operable in the manner known per se among those skilled in the art.

One of the most important features of the present invention is to adjust the thickness of the metal film to the range of 20–300 Å, preferably 50–200 Å. Such a very thin metal layer is quite unbelievable and far beyond the normal sense of metallizing treatments of the resinous materials. In contrast to the conventional metallized resinous articles looking like a real metal in appearance in which the thickness of the metal film is generally within the range of 0.05–1$\mu$ (500–10000 Å), the metallized resinous articles do not look like a metal in appearance but show a specific a concealed tone of metallic luster with the original color tint of the resin, thus imparting as a whole a deeply noble feeling to the resinous articles. The metallic color brought about by the products of this invention is new and has never been seen in the conventional metallized resinous articles. If the thickness of the metal film is thinner than 20 Å, the metallic luster of the colored resinous articles will disappear. On the other hand, if the thickness of the metal film exceeds 300 Å, delicateness of a concealed tone of metallic luster will be lost and the original color tint of the resin will be hidden by the increased metallic luster. The thickness of the metal film may thus be varied within the range of 20–300 Å according to the brightness and intensity of the color tint used in the resin.

In the third step of the coating treatment, the thin metal film is overlaid on the surface thereof with a protective top coat. A paint utilizable as the top coat for protecting the metal film should be transparent and the resinous component used in the paint should be excellent in adhesion to the metal film in addition to the aforementioned various resisting properties. The paint satisfying the requirements for the top coat is applied onto the metal film, as in the case of the base coat paint, according to the conventional coating, method such as spray coating flow coating and dipping. It is possible to use a combination of these coating methods. It is also possible to use the same coating method as used in the application of the base coat. For the top coat, the same conditions as referred to in the base coat can also be employed in connection with the concentration of the resin in the paint, the proportion of the polyol component to the polyisocyanate component and the curing treatment of the resin. The amount of the paint applied is properly adjusted so that the thickness of the dried top coat may be within the range of 5–50μ, preferably 10–30μ. The top coat may be thicker and may contain a larger amount of the UV-absorbing agent or the like stabilizer to the particular application where especially remarkable abrasion-resistance and weather-resistance are demanded.

The colored resinous articles of the present invention possess a specific concealed tone of metallic luster with the original color tint of the resin in addition to a good wax-removing property and strong resistance to weathering action, abrasion and warm water. Accordingly, various colors with a concealed tone of metallic luster exhibited by the products of this invention are never seen in metallized resinous articles obtained by the conventional matallizing treatment and impart a deeply noble feeling to the metallized products. The products of this invention form no cracks nor streaks even if the products are subjected to deformation to a certain extent and are hardly susceptible to clouding or whitening resulting from degradation of the top coat.

The products of the present invention are distinguished by their enhanced aesthetic value and are especially useful as parts of motor vehicles exposed under severe conditions. The color of the products of this invention accompanied with specific concealed tone of metallic luster keep the deeply noble feeling for an extended period of time. Thus, the products of this invention are also useful as indoor and outdoor ornaments.

The present invention will now be illustrated in more detail by way of examples wherein all the parts are by weight unless otherwise indicated. In these examples, a mixture of UV-absorbing agents of benzotriazole series mentioned hereinbefore is used to enhance weather resistance. The equivalent effect can of course be expected also in case of using a single UV-absorbing agent of benzotriazole. Results of all the tests except abrasion-resistance were evaluated by visual observation of the tested samples (Table 1).

EXAMPLE 1

A paint comprised of 100 parts of an acrylic copolymer (2-hydroxyethyl acrylate series) having an OH number of 20, 20 parts of hexamethylene diisocyanate (NCO content: 13.6%), 2 parts of an UV-absorbing agent (benzotriazole type) and 1 part of a levelling agent (silicone type) in 80 parts of a thinner comprised of toluene, xylene, MEK and ethyl acetate each in 25% by weight was applied as base coat onto the surface of a molded article made of 100 parts of ABS resin (ABS 360 marketed by Toray, Japan) incorporated with 1 part of carbon black. The molded article thus coated was subjected to setting for 10 minutes and then heated for 2 hours at 80° C. to cure the coated film. After the curing treatment, the coated article was subjected to setting for 15 minutes at room temperature. Metallic chromium was applied onto the coated article by sputtering to form a thin film of chromium having a thickness of 100 Å on the surface of the base coat.

After the sputtering treatment, a paint comprised of 100 parts of an acrylic copolymer (2-hydroxyethyl acrylate series) having an OH number of 30, 25 parts of a diisocyanate of isophorone series (NCO content: 16%), 2 parts of an UV-absorbing agent (benzotriazole type) and 1 part of a levelling agent (silicone type) in 70 parts of a thinner comprised of toluene, MEK, MIBK, ethyl acetate and cellosolve acetate each in 20% by weight was applied as top coat onto the metallized article until the thickness of the dry coated film became 15μ. The article thus coated was dried for 60 minutes at 70° C.

The performance of the product thus obtained is shown in Table 1 from which it is understood that the product is excellent in resistance to heat, weathering action, alkali and warm water. This product was never obtained in the past and is quite different from the conventional metallized products, showing an appearance of metallic feeling and a concealed tone of luster of black which is the tint of the resin.

EXAMPLE 2

A colored resinous product was manufactured under the same conditions as described in Example 1, using the same base coat, sputtering metal and top coat as described in Example 1 except that a PBT resin incorporated with 3% by weight of Phthalocyanine Blue and 1% by weight of titanium oxide was used in place of the carbon black-incorporated ABS resin used in Example 1. A result of tests made on the performance of the product is shown in Table 1. The metallic luster and the color tint of the product were excellent.

EXAMPLE 3

A paint comprised of 100 parts of an acrylic copolymer (2-hydroxypropyl acrylate series), xylylene diisocyanate in an amount such that the NCO number became equal to the OH number, and 1 part of a levelling agent (silicone type) in 80 parts of a thinner comprised of toluene, xylene, MIBK and butyl acetate each in 25% by weight was applied as base coat onto the surface of a molded article made of 100 parts of an AAS resin (Vitax, Hitachi Kasei, Japan) incorporated with 2 parts of chromophthalic pigment Bordeaux, 1 part of Quinacridone Red, 1 part of carbon black and 0.2 part of Azo Yellow D. The molded article thus coated was subjected to setting for 10 minutes and then heated for 120 minutes at 80° C. to cure the coated film. The coated article was then subjected to setting for 10 minutes at room temperature. Hastelloy C (a Ni-Cr-Fe alloy) was applied onto the base coat by sputtering to form a thin film of the alloy having a thickness of 200 Å. After the sputtering treatment, a paint comprised of 100 parts of an acrylic copolymer (2-hydroxypropyl acrylate series), an isocyanate prepolymer of 1,6-hexamethylene diisocyanate and tripropanolethane in a mixing ratio of 3:1 in an amount such that the NCO number of the prepolymer became equal to the OH number of the copolymer, 2 parts of an UV-absorbing agent (benzotriazole type) and 1 part of a levelling agent (silicone type) in 60 parts of a thinner comprised of toluene, xylene and MEK each in 25% by weight and 15% by weight of ethyl acetate and 10% by weight of cellosolve acetate was applied as top coat onto the metallized article until the thickness of the dry coated film became 25μ. The article thus coated was dried for 60 minutes at 70° C.

A result of tests made on the performance of this product is shown in Table 1. The metallic luster and the color tint of the product were never seen in the conventional metallized products.

EXAMPLE 4

The same base coat as used in Example 3 was applied to a molded resinous article according to the method as described in Example 3 except that PP colored with carbon black and the same organic pigments as described in Example 3 was used in place of the AAS resin used in Example 3 and a clear paint of a chlorinated olefin series (RB-191 marketed by Nippon Bee Chemical Co., Ltd., Japan) was applied as primer onto the molded article to form a film of 5μ in thickness and dried for 30 minutes at 70° C. prior to the application of the base coat. Metallic chromium was then applied onto the base coat by ion plating to form a thin layer of chromium having a thickness of 150 Å. The same top coat as used in Example 3 was applied onto the thus metallized article to form a film of 20μ in thickness.

A result of tests made on the performance of this product is shown in Table 1. The concealed tone of metallic luster of this product gave an impression of noble feeling without changing the original tint of the colored resin.

EXAMPLE 5

A colored resinous product was manufactured by using the same materials and method as described in Example 3 except that Noryl resin (Noryl 822, EPL) was used in place of the AAS resin used in Example 3. A result of tests made on the performance of this product is shown in Table 1.

In this example, the base coat was colored with carbon black and the same organic pigments as described in Example 3 each in an amount equal to that used in Example 3. This product showed a concealed tone of metallic luster without changing the original tint of the base coat.

TABLE 1

| Test items | Test conditions | Example Nos. 1 | 2 | 3 | 4 | 5 |
|---|---|---|---|---|---|---|
| Heat-resistance | | 80° C. × 1000 hr | 80° C. × 1000 hr | 80° C. × 1000 hr | 70° C. × 200 hr | 80° C. × 400 hr |
| Weather-resistance | Sunshine Weather-o-meter | 2000 hr | 2000 hr | 2000 hr | 1000 hr | 1000 hr |
| Alkali-resistance | 0.1 N aqueous solution of NaOH room temperature | 400 hr | 400 hr | 400 hr | 400 hr | 400 hr |
| Warm water-resistance | 40° C. | 1000 hr | 1000 hr | 1000 hr | 400 hr | 400 hr |
| Abrasion-resistance | Taber abraser CS-10, 500 g Load | 1000 cycles | 1000 cycles | 1000 cycles | 1000 cycles | 1000 cycles |
| Moisture-resistance | 50° C., >95% RH | 500 hr | 500 hr | 500 hr | 500 hr | 500 hr |

(Remarks)
Abrasion resistance:
A sample was subjected to a rotary rubbing action of a taber abraser defined in ASTM D-1175 (Tests for abrasion of textile fabrics) in which an abrasive wheel CS #10 is used under a load of 500 g to measure the number of revolutions required to give exposure of the substrate by wearing out the metal film and the under coat.

It is understood that the preceding representative examples may be varied within the scope of the present invention, both as to the materials and conditions, by those skilled in the art to achieve essentially the same results.

As many apparently widely different embodiments of the present invention may be made without departing from the spirit and scope thereof, it is to be construed that the present invention is not limited to the specific embodiments thereof except as defined in the appended claims.

What is claimed is:

1. A rigid colored resinous article having a concealed metallic luster which comprises (a) a rigid, resinous molded article having been overlaid on the surface thereof successively with (b) a highly weather-resistance two-component polyurethane paint or UV-curable pain as a base coat, (c) a filmy layer of a metal of 2-150 Å in thickness which has been applied onto the base coat by dry plating so that said colored resinous article transmits color of the base coat or resinous article through the filmy layer of metal has a concealed metallic luster, and (d) a transparent highly weather-resistant and abrasion-resistant two-component polyurethane paint or UV-curable paint as a top coat, either of said (a) and said (b) having incorporated thereinto a material of a desired color tint.

2. A colored resinous article having a concealed metallic luster according to claim 1, wherein the resinous molded article is made of thermocurable resins selected from those of phenol series, urea series, epoxy series and unsaturated polyester series.

3. A colored resinous article having a concealed metallic luster according to claim 1, wherein the resinous molded article is made of a thermoplastic resin selected from the group consisting of ABS, PP, PVC, AAS, AES, Noryl resins, PMMA, PC, PBT, PEP, PA and a polyblend of these resins.

4. A colored resinous article having a concealed metallic luster according to claim 1, wherein the resinous molded article has been incorporated with the material of a desired color tint.

5. A colored resinous article having a concealed metallic luster according to claim 1, wherein the two-component polyurethane paint comprises a polyol selected from the group consisting of acrylic polyols, polyester polyols and polyether polyols and an anti-yellowing polyisocyanate containing neither aromatic group nor color-forming group in the molecule.

6. A colored resinous article having a concealed metallic luster according to claim 5, wherein the acrylic polyol is a copolymer of hydroxyalkyl acrylate and/or methacrylate with alkyl acrylate and/or methacrylate.

7. A colored resinous article having a concealed metallic luster according to claim 1, wherein the UV-curable paint comprises an unsaturated polyester polymerizable by the action of UV-rays.

8. A colored resinous article having a concealed metallic luster according to claim 1, wherein an UV-absorbing agent has been incorporated into the base coat and/or top coat.

9. A colored resinous article having a concealed metallic luster according to claim 1, the paint for top coat is identical in composition with the paint for base coat.

10. A process for the manufacture of a colored resinous article having a concealed metallic luster, which comprises applying onto the surface of (a) a resinous molded article (b) a highly weather-resistant two component polyurethane paint or UV-curable paint as base coat, either of said (a) and said (b) having incorporated thereinto a material of a desired color tint, applying (c) a filmy layer of a metal of 20–150 Å in thickness onto the base coat by means of dry plating, and then applying (d) a transparent, highly weather-resistant and abrasion-resistant two-component polyurethane paint or UV-curable paint as top coat onto said (c).

11. A process according to claim 10, wherein the resinous molded article is made of thermocurable resins selected from those of phenol seies, urea series, epoxy series and unsaturated polyester series.

12. A process according to claim 10, wherein the resinous molded article is made of a thermoplastic resin selected from the group consisting of ABS, PP, PVC, AAS, AES, Noryl resins, PMMA, PC, PBT, PEP, PA and a polyblend of these resins.

13. A process according to claim 10, wherein the resinous molded article has been incorporated with the material of a desired color tint.

14. A process according to claim 10, wherein the two-component polyurethane paint comprises a polyol selected from the group consisting of acrylic polyols, polyester polyols and polyether polyols and an anti-yellowing polyisocyanate which contains neither aromatic group nor color-forming group in the molecule.

15. A process according to claim 14, wherein the acrylic polyol is a copolymer of hydroxyalkyl acrylate and/or methacrylate with alkyl acrylate and/or methacrylate.

16. A process according to claim 10, wherein the UV-curable paint comprises an unsaturated polyester polymerizable by the action of UV-rays.

17. A process according to claim 10, wherein an UV-absorbing agent has been incorporated into the paint for the base coat and/or top coat.

18. A process according to claim 10, wherein the filmy layer of a metal is applied onto the base coat by dry plating.

19. A process according to claim 10, wherein the metal is selected from metals and alloys excellent in weather-resistance and corrosion-resistance.

20. A process according to claim 10, wherein the paint for top coat is identical in composition with the paint for base coat.

21. A process according to claim 10, wherein the paint for base coat and the paint for top coat are applied by means of spray coating.

* * * * *

UNITED STATES PATENT AND TRADEMARK OFFICE
CERTIFICATE OF CORRECTION

PATENT NO. : 4,551,387
DATED      : November 5, 1985
INVENTOR(S): MANABE et al

It is certified that error appears in the above-identified patent and that said Letters Patent is hereby corrected as shown below:

On the title page:
Priority Data Omitted. Should read:

--Japan    Sho 57-159493    September 16, 1982--

Signed and Sealed this

Fifteenth Day of July 1986

[SEAL]

Attest:

DONALD J. QUIGG

Attesting Officer

Commissioner of Patents and Trademarks